(12) United States Patent
Borg et al.

(10) Patent No.: US 10,727,051 B2
(45) Date of Patent: Jul. 28, 2020

(54) SEMICONDUCTOR NANOWIRE FABRICATION

(71) Applicant: ELPIS TECHNOLOGIES INC., Ottawa (CA)

(72) Inventors: Mattias Bengt Borg, Adliswil (CH); Kirsten Emilie Moselund, Rueschlikon (CH); Heike E. Riel, Baech (CH); Heinz Schmid, Waedenswil (CH)

(73) Assignee: ELPIS TECHNOLOGIES INC., Ottawa (CA)

( * ) Notice: Subject to any disclaimer, the term of this patent is extended or adjusted under 35 U.S.C. 154(b) by 0 days.

(21) Appl. No.: 16/212,000

(22) Filed: Dec. 6, 2018

(65) Prior Publication Data

US 2019/0109003 A1    Apr. 11, 2019

Related U.S. Application Data

(63) Continuation of application No. 15/102,553, filed as application No. PCT/IB2014/066695 on Dec. 8, 2014, now Pat. No. 10,153,158.

(30) Foreign Application Priority Data

Dec. 12, 2013    (GB) .................................. 1321949.8

(51) Int. Cl.
*H01L 21/20*    (2006.01)
*H01L 21/02*    (2006.01)
*H01L 21/762*    (2006.01)

(52) U.S. Cl.
CPC .... *H01L 21/02603* (2013.01); *H01L 21/0262* (2013.01); *H01L 21/02422* (2013.01);
(Continued)

(58) Field of Classification Search
CPC ......... H01L 21/02603; H01L 21/02639; H01L 21/02422; H01L 21/0262; H01L 21/02645;
(Continued)

(56) References Cited

U.S. PATENT DOCUMENTS 4,952,526 A    8/1990 Pribat et al.
4,999,314 A    3/1991 Pribat et al.
(Continued)

FOREIGN PATENT DOCUMENTS

JP    S6351622 A    4/1988
JP    H01300514 A    12/1989
(Continued)

OTHER PUBLICATIONS

List of IBM Patents or Patent Applications Treated As Related; (Appendix P), Dec. 7, 2018, 2 pages.
(Continued)

*Primary Examiner* — Vu A Vu

(57) ABSTRACT

Methods are provided for fabricating semiconductor nanowires on a substrate. A nanowire template is formed on the substrate. The nanowire template defines an elongate tunnel which extends, laterally over the substrate, between an opening in the template and a seed surface. The seed surface is exposed to the tunnel and of an area up to about $2 \times 10^4$ nm$^2$. The semiconductor nanowire is selectively grown, via said opening, in the template from the seed surface. The area of the seed surface is preferably such that growth of the nanowire proceeds from a single nucleation point on the seed surface. There is also provided a method for fabricating a plurality of semiconductor nanowires on a substrate and a semiconductor nanowire and substrate structure.

14 Claims, 5 Drawing Sheets

(52) U.S. Cl.
CPC .. *H01L 21/02546* (2013.01); *H01L 21/02639* (2013.01); *H01L 21/02645* (2013.01); *H01L 21/76262* (2013.01); H01L 21/02647 (2013.01)

(58) Field of Classification Search
CPC ......... H01L 21/76262; H01L 21/02546; H01L 21/02647
USPC ...................................................... 438/438
See application file for complete search history.

(56) References Cited

U.S. PATENT DOCUMENTS

| | | | |
|---|---|---|---|
| 5,360,754 A * | 11/1994 | Pribat | C30B 25/18 117/90 |
| 6,159,831 A * | 12/2000 | Thrush | C30B 25/00 438/582 |
| 6,681,331 B1 | 1/2004 | Munson et al. | |
| 7,115,306 B2 * | 10/2006 | Jeong | B82Y 30/00 427/577 |
| 7,185,367 B2 | 2/2007 | Munson | |
| 7,296,288 B1 | 11/2007 | Hill et al. | |
| 7,594,270 B2 | 9/2009 | Church et al. | |
| 7,960,255 B2 * | 6/2011 | Coronel | B82Y 10/00 257/E21.09 |
| 9,032,521 B2 | 5/2015 | Amini et al. | |
| 10,153,158 B2 * | 12/2018 | Borg | H01L 21/02546 |
| 2005/0044406 A1 | 2/2005 | Stute | |
| 2007/0017439 A1 * | 1/2007 | Xianyu | C30B 25/005 117/108 |
| 2007/0169195 A1 | 7/2007 | Anand et al. | |
| 2007/0294187 A1 | 12/2007 | Scherrer | |
| 2008/0141374 A1 | 6/2008 | Sidiroglou et al. | |
| 2008/0271143 A1 | 10/2008 | Stephens et al. | |
| 2009/0064337 A1 | 3/2009 | Chien | |
| 2010/0070498 A1 | 3/2010 | Zhang et al. | |
| 2010/0115621 A1 | 5/2010 | Staniford et al. | |
| 2010/0144126 A1 | 6/2010 | Lee et al. | |
| 2010/0203712 A1 | 8/2010 | Coronel et al. | |
| 2012/0025195 A1 * | 2/2012 | McComber | C23C 16/04 257/65 |
| 2013/0158210 A1 | 6/2013 | Hossain et al. | |
| 2016/0351391 A1 | 12/2016 | Borg et al. | |

FOREIGN PATENT DOCUMENTS

| | | |
|---|---|---|
| JP | H0210825 A | 1/1990 |
| JP | H06140346 A | 2/1994 |

OTHER PUBLICATIONS

Abercrombie, R.K., Sheldon, F.T., Mili, A.; (2009); "Managing Complex IT Security Processes with Value Based Measures"; 2009 IEEE Symposium on Computation Intelligence in Cyber Security; CICS 2009; ISBN: 9781424427697.

Fayssal, S., Hariri, S., Al-Nashif, Y. (2007); "Anomaly-Based Behavior Analysis of Wireless Network Security"; 4th Annual International Conference on Mobile and Ubiquitous Systems: Computing, Networking and Services, MobiQuitoous 2007, 07EX1702, IEEE Com.

Yu et al., "An Automatically Tuning Intrusion Detection System", IEEE Transactions on Systems, Man, and Cybernetis Part B: Cybernetics, vol. 37, No. 2, Apr. 2007; pp. 373-384.

* cited by examiner

SEMICONDUCTOR NANOWIRE FABRICATION

CROSS REFERENCE TO RELATED APPLICATIONS

This application is a continuation of U.S. patent application Ser. No. 15/102,553, titled "Semiconductor Nanowire Fabrication" filed Jun. 8, 2016, which claims priority from 35 U.S.C. § 371 from PCT Application PCT/IB2014/066695, filed on Dec. 8, 2014, which claims priority from UK Patent Application No. 1321949.8, filed Dec. 12, 2013. The entire contents of all applications are incorporated herein by reference.

TECHNICAL FIELD OF THE INVENTION

This invention relates to fabrication of semiconductor nanowires and provides methods for fabricating semiconductor nanowires on a substrate and a semiconductor structure obtainable by such methods.

BACKGROUND OF THE INVENTION

It has long been known that semiconductor structures can be formed by patterning trenches of the desired shape on a substrate and then depositing semiconductor material to fill the trenches. US Patent Applications publication no's. 2011/0306179 and 2011/0086491 describe exemplary processes for forming III-V semiconductor structures in this way. A fundamental problem with the patterned-trench technique is that defects tend to occur in the resulting crystal structure of the semiconductor. One technique to restrict these defects, known as aspect ratio trapping (ART), involves controlling the aspect ratio of a trench defined between sidewalls of a mask such that dislocations in the semiconductor structure formed in the trench tend to terminate at the mask sidewalls. Defects are then inhibited in an upper region of the semiconductor structure above the dislocations. Examples of this type of technique are described in U.S. Pat. No. 8,324,660 and "Integration of InGaAs Channel n-MOS Devices on 200 mm Si Wafers Using the Aspect-Ratio-Trapping Technique", Waldron et al., ECS Transactions, 45 (4) 115-128 (2012).

Defects have also been reduced in semiconductor structures using the technique of confined epitaxial layer overgrowth (ELO). With this technique, planar semiconductor structures have been grown laterally (i.e. generally parallel to the plane of the substrate) from seeds in the form of elongate stripes of monocrystalline semiconductor material. Selective epitaxial growth proceeds laterally from the seed stripes in tunnel areas defined between upper and lower confining surfaces. Examples of this technique are described in: "A New Epitaxy Technique for Device Isolation and Advanced Device Structures", Schubert & Neudeck, Eight Biennial University/Government/Industry Symposium 1989; "Novel technique for Si epitaxial lateral overgrowth: Tunnel epitaxy", Ogura & Fujimoto, Appl. Phys. Lett. 55, 2205 (1989); "50-nm-Thick Silicon-on-Insulator Fabrication by Advanced Epitaxial Lateral Overgrowth: Tunnel Epitaxy", Ogura et al., J. Electrochem. Soc., Vol. 140, No. 4, April 1993; "Structural Characterization of Conformally Grown (100) Si Films", Pribat et al., Japanese Journal of Applied Physics, Vol. 29, No. 11, 1990, pp. L1943-L1946; "Defect Filtering in GaAs on Si by Conformal Growth", Pribat et al., Japanese Journal of Applied Physics, Vol. 30, No. 3B, 1991, pp. L431-L434; and U.S. Pat. Nos. 4,952,526 and 5,360,754. This confined ELO lateral growth technique has been used to grow planar, or two-dimensional, layer structures only.

Growth of defect-free semiconductor nanowires presents a particular challenge. Nanowires can be considered essentially "one-dimensional" structures, being elongate in form but having a transverse thickness, i.e. perpendicular to the longitudinal axis of the nanowire, of up to about 200 nm and more commonly up to about 100 nm. In many current applications, nanowire thickness is typically no greater than 100 nm. The cross-sectional shape of nanowires can vary considerably, common examples including rounded, e.g. circular, cross-sections as well as generally rectangular cross-sections giving a ribbon-shaped nanowire or "nanoribbon". The cross-sectional dimensions, i.e. the width and breadth of the nanowire, are however usually up to about 100 nm in each case. Hence, while nanowires can typically range from nanometers to many microns in length, the cross-sectional area of a nanowire is constrained to a few tens of thousands of $nm^2$, usually about $10^4$ $nm^2$ or less, and is most typically no greater than $10^4$ $nm^2$.

In all of the above-disclosed methods using ART or ELO, defects originating from the lattice mismatch as well as the polar/non-polar interface at the heterojunction can only be reduced and not completely avoided.

For growth of semiconductor nanowires on a substrate, a technique known as vapor-liquid-solid (VLS) deposition has been used to grow nanowires from metal catalyst particles. In "Confinement-Guided Shaping of Semiconductor Nanowires and Nanoribbons: Writing with Nanowires", Pevzner et al., Nano Lett. 2012, 12, 7-12, this technique is used for lateral growth of nanowires from gold particles confined in tunnels on a silicon wafer. The resulting nanowires exhibit various defects. As discussed in U.S. Pat. No. 8,084,337, for example, and US Patent Application publication no. 2010/0261339, reduced defects can be achieved with this technique of growing nanowires from catalyst particles when the nanowires are grown vertically out of the substrate. "Synthesis of Vertical High-Density Epitaxial Si(100) Nanowire Arrays on a Si(100) Substrate Using an Anodic Aluminum Oxide Template", Shimizu et al., Adv. Mater. 2007, 19, 917-920, also describes use of this technique to grow nanowires vertically from catalyst particles in a vertical nanopore array on a substrate.

Other techniques for nanowire growth are described in European Patent Application publication no. EP 2,378,557 A1, US Patent Application publication no. 2011/0253982 A1, and "Selective area growth of III-V nanowires and their hetero structures on silicon in a nanotube template: towards monolithic integration of nano-devices", Kanungo et al., Nanotechnology 24 (2013) 225304. Again, all these documents teach vertical nanowire fabrication techniques with a view to achieving nanowires with reduced defects. In EP 2,378,557 A1, vertical nanowires are produced by removing, e.g. etching, material from a masked stack. In the Kanungo et al. paper, vertical nanowires are grown in a nanotube template structure made by coating a pre-formed sacrificial array of vertical nanowires. In US 2011/0253982 A1, a vertical III-V nanowire array is produced by direct epitaxial growth on a silicon substrate.

An improved technique for fabrication of high-quality semiconductor nanowires on substrates would be highly desirable.

SUMMARY OF THE INVENTION

According to a first aspect of the present invention, a method for fabricating a semiconductor nanowire on a substrate is provided. The method includes: forming a nanowire template defining an elongate tunnel which extends, laterally over the substrate, between an opening in the template and a seed surface, the seed surface being exposed to the tunnel and having an area up to about $2\times10^4$ $nm^2$; and selectively growing the semiconductor nanowire in the template from the seed surface via the opening.

Another aspect of the present invention provides a method for fabricating a plurality of semiconductor nanowires on a substrate. The method includes: forming a plurality of nanowire templates defining an elongate tunnel which extends, laterally over the substrate, between an opening in the template and a seed surface, the seed surface being exposed to the tunnel and having an area up to about $2\times10^4$ $nm^2$; and selectively growing the plurality of semiconductor nanowires in the templates from the seed surface via the opening, wherein the nanowire templates are vertically-stacked on the substrate.

The present invention also provides a semiconductor nanowire and substrate structure. The structure includes: a nanowire template defining an elongate tunnel which extends, laterally over the substrate, between an opening in the template and a seed surface, the seed surface being exposed to the tunnel and having an area up to about $2\times10^4$ $nm^2$; and a semiconductor nanowire selectively grown in the template from the seed surface via the opening.

BRIEF DESCRIPTION OF THE SEVERAL VIEWS OF THE DRAWINGS

Preferred embodiments of the invention will now be described, by way of example, with reference to the accompanying drawings in.

FIG. 1a is a schematic cross-sectional view illustrating a successive stage in a first nanowire fabrication process embodying the invention;

FIG. 1b is a schematic cross-sectional view illustrating a successive stage in a first nanowire fabrication process embodying the invention;

FIG. 1c is a schematic cross-sectional view illustrating a successive stage in a first nanowire fabrication process embodying the invention;

FIG. 1d is a schematic cross-sectional view illustrating a successive stage in a first nanowire fabrication process embodying the invention;

FIG. 1e is a schematic cross-sectional view illustrating a successive stage in a first nanowire fabrication process embodying the invention FIG. 1f is a schematic cross-sectional view illustrating a successive stage in a first nanowire fabrication process embodying the invention; and FIG. 1g is a schematic cross-sectional view illustrating a successive stage in a first nanowire fabrication process embodying the invention.

FIG. 3a is a schematic cross-sectional view illustrating a successive stage in a second nanowire fabrication process embodying the invention;

FIG. 3b is a schematic cross-sectional view illustrating a successive stage in a second nanowire fabrication process embodying the invention;

FIG. 3c is a schematic cross-sectional view illustrating a successive stage in a second nanowire fabrication process embodying the invention;

FIG. 3d is a schematic cross-sectional view illustrating a successive stage in a second nanowire fabrication process embodying the invention; and FIG. 3e is a schematic cross-sectional view illustrating a successive stage in a second nanowire fabrication process embodying the invention.

FIG. 5a shows an example of nanowires with varying cross-sections and branched structures produced by methods embodying the invention; and FIG. 5b shows an example of nanowires with varying cross-sections and branched structures produced by methods embodying the invention.

FIG. 6a shows a stage in another fabrication process embodying the invention using vertically-stacked nanowire templates; and FIG. 6b shows a stage in another fabrication process embodying the invention using vertically-stacked nanowire templates.

DETAILED DESCRIPTION OF THE PREFERRED EMBODIMENTS

Figure 1A:
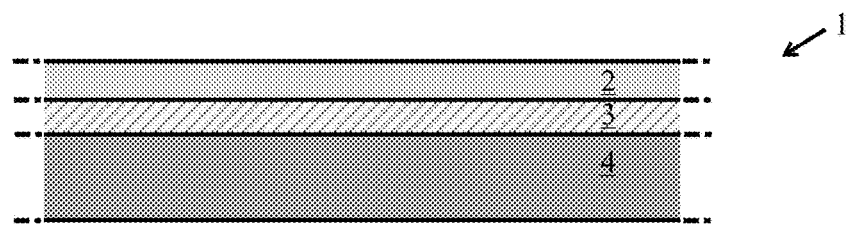
FIGS. 1a to 1g are schematic cross-sectional views illustrating successive stages in a first nanowire fabrication process embodying the invention. More specifically.

FIG. 1a is a schematic cross-section through a semiconductor-on-insulator wafer 1 which provides the substrate for the first nanowire fabrication process. Such a wafer might be a SOI (Silicon On Insulator) wafer, a GeOI (Germanium On Insulator) wafer, or an XOI wafer having any other semiconductor material on insulator. These wafers include three layers. A thin, typically 10-200 nm thick, semiconductor device layer (Si, Ge or X) 2 is bonded or deposited on a silicon oxide insulating layer 3 which in turn overlies a thick silicon handle wafer 4. The semiconductor device layer 2 serves as a seed layer for the nanowire fabrication process, the semiconductor material of this layer functioning as a seed material for growth of the nanowire as described further below.

Figure 1B:
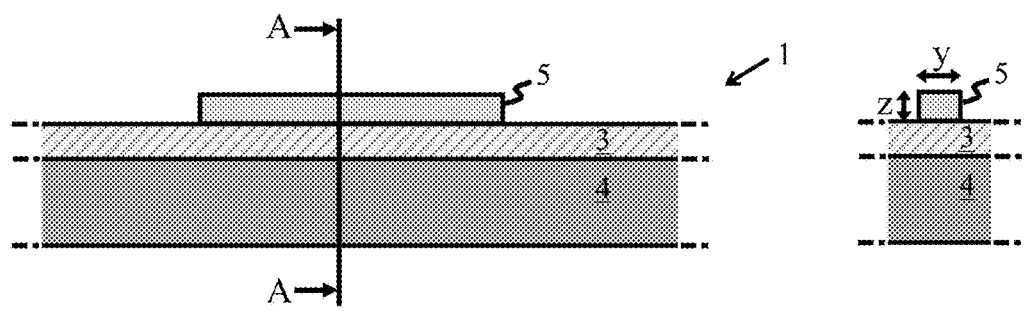

A first stage of the fabrication process involves forming a template for the nanowire. This template defines the shape of the nanowire to be formed, and thus defines an elongate tunnel the dimensions of which are determined by the dimensions of the nanowire to be formed. A first step in formation of the nanowire template is illustrated in FIG. 1b. The device layer, or seed layer, 2 is patterned to form a seed region 5 in the shape of the interior of the template. This patterning step exposes the insulating layer 3 around the seed region 5, and can involve reducing the thickness of device layer 2 to give the desired thickness of seed region 5. The seed region 5 defines the shape of the target nanowire structure. In this simple example, the seed region 5 is an elongate, linear region of uniform rectangular cross-section as illustrated on the right-hand side of FIG. 1b which shows a schematic cross-section on A-A of the left-hand view in the figure. The transverse cross-section of seed region 5 has a thickness z and a width y, where each of these dimensions is no greater than 100 nm in accordance with the required dimensions of the nanowire to be formed here. Each dimension y, z is generally less than 100 nm, and typically in a range of from 10 to 100 nm.

Figure 1C:
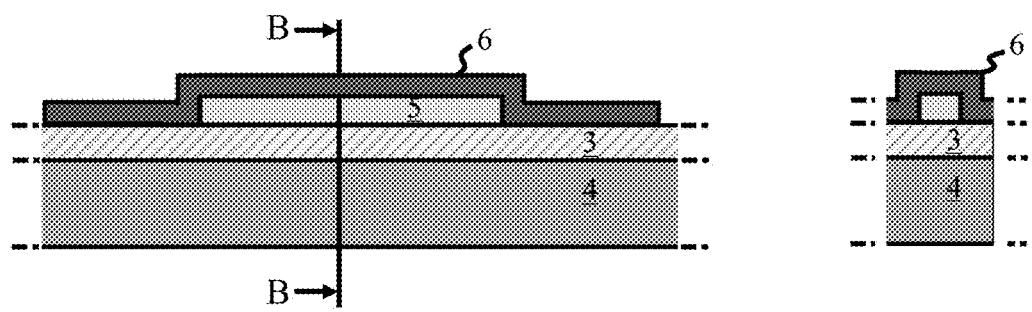

In a second step of the fabrication process, a masking layer 6 is formed over, and in contact with, the seed region 5 and the surrounding insulating layer 3. The result of this step is illustrated in FIG. 1c, where the right-hand view shows a cross-section on B-B of the left-hand view in the figure. The masking layer 6 thus covers the entire surface of the seed region 5. This masking layer and the insulating layer underlying seed region 5 will together form the nanowire template following additional processing steps described below. The material of the masking layer is selected to have a low sticking coefficient, and hence low nucleation probability, for the semiconductor material of the nanowire to be grown. This masking layer is typically an insulating layer, e.g. of an oxide such as silicon oxide or silicon nitride, but might also be a layer of carbon or other material which suppresses deposition of the semiconductor on the masking layer during the subsequent selective growth of the nanowire.

Figure 1D:
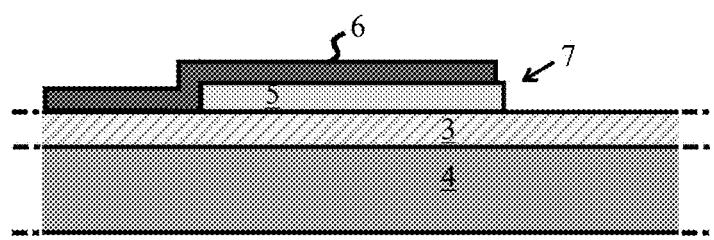
Figure 1E:
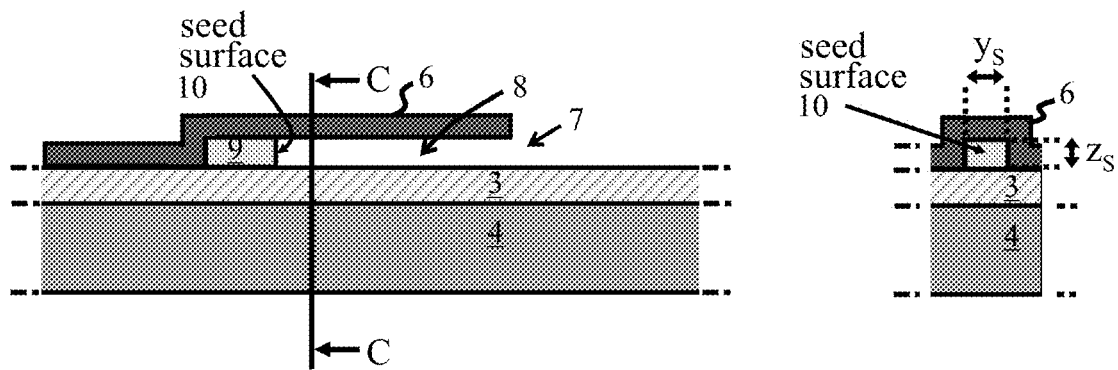

In a next step of the process, illustrated in FIG. 1d, an opening 7 is defined in the masking layer 6. The opening 7 is formed by removing part of the masking layer overlying one end of seed region 5 to expose the seed region. Next, part of the seed region 5 is removed, e.g. by etching, via the opening 7 to form the elongate tunnel, or nanotube, 8 which provides the hollow interior of the nanowire template. This stage is illustrated in FIG. 1e. A remaining part 9 of the seed region provides a seed surface 10 which is exposed to the tunnel 8. In this preferred embodiment, the seed surface 10 extends across the transverse tunnel cross-section substantially perpendicular to the longitudinal axis of the tunnel, thereby occluding one end of the tunnel. The tunnel 8 thus extends laterally over the substrate wafer between the seed surface 10 and the opening 7 in the resulting nanowire template. The right-hand side of FIG. 1e depicts a cross-section on C-C of the left-hand view here and shows the seed surface 10. The seed surface has width $y_s$ and breadth $z_s$, and the area $A_s = y_s \times z_s$ of this surface is no greater than $10^4$ nm$^2$. Since the dimensions of the seed surface correspond to the transverse dimensions of the desired nanowire in this embodiment, each of dimension $y_s$ and $z_s$ is no greater than 100 nm here. The seed surface area is thus generally less than $10^4$ nm$^2$ in this preferred embodiment, and is typically between 100 and $10^4$ nm$^2$. Moreover, in this preferred embodiment, the area $A_s$ of the seed surface is such that the ensuing selective growth of the nanowire proceeds from a single nucleation point on the seed surface. This is discussed further below.

Figure 1F:
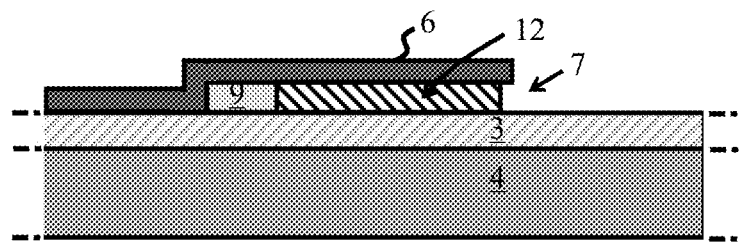

Prior to the nanowire growth step, the seed surface 10 can be cleaned if required, e.g. by flushing with a cleaning agent, to remove any surface oxidation. The next stage involves selectively growing the semiconductor nanowire in the template from the seed surface 10. This is achieved here using metal-organic vapor phase deposition (MOCVD) or migration enhanced epitaxy (MEE) of the semiconductor material via the opening 7 in the template. The semiconductor material of the nanowire is preferably a compound semiconductor such as a III-V semiconductor, or a II-VI semiconductor for example. The nanowire template is thus epitaxially filled by the compound semiconductor from seed surface 10, with the nanowire growth being confined to the tunnel 8. The result of this step is shown in FIG. 1f where the nanowire 12 is grown to substantially the full length of the tunnel 8. Due to restriction of the seed surface area as discussed above, the selective growth conditions are such that epitaxial growth of the nanowire proceeds from a single nucleation point on the seed surface. Nucleation at the seed surface depends on the seed surface area and the mobility of atoms diffusing over the seed surface during the deposition process. If the dimensions $y_s$, $z_s$ of the seed surface are considerably less than the average diffusion length of the atoms at the operating temperature of the process, then growth from a single nucleation point can be obtained. Precise constraints on the seed surface area will thus vary for individual processes depending on the particular materials and process parameters, but suitable values will be apparent to those skilled in the art based on the principles described herein.

During the template filling process, the composition of the material can be varied if desired, and dopants can be introduced. Growth can be interrupted if required to allow etching and/or cleaning steps to be performed so as to remove parasitic deposition on the mask surfaces and to improve selectivity of the template filling process.

Figure 1G:
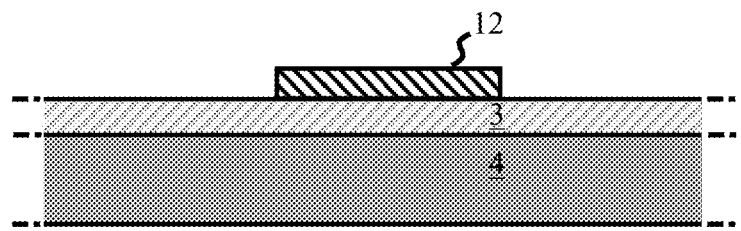

On completion of nanowire growth, the masking layer 6 and remaining seed region 9 can be removed, e.g. by etching, to expose the nanowire on substrate wafer 1. This is shown in FIG. 1g. The nanowire 12 can then be optimized if desired, e.g. to refine the shape, reduce the length, etc., and subsequent device processing steps can be performed if appropriate to build a required device structure around the nanowire. For example, nanowire 12 can be used to build a field effect transistor such as a tunnel field effect transistor, a diode, a laser etc. using the basic nanowire structure. The nanowire 12 can also be used as a seed layer in a subsequent repeated process if desired.

The basic nanowire fabrication steps described above can be performed using well-known material processing techniques. By way of illustration, details of an exemplary process for fabricating an Indium-Arsenide nanowire on an SOI wafer are described in the following. An SOI wafer with a 70 nm device layer was processed to form the seed region 5 of FIG. 1b by electron beam lithography and reactive ion etching. The seed region had a length of 3 μm and dimensions y, z of 70 nm each. A masking layer 6 of SiO$_2$ was deposited to a thickness of 100 nm by plasma-enhanced chemical vapour deposition. Opening 7 was formed by optical lithography and the seed region was partially removed by a tetramethylammonium hydroxide wet etch to achieve the template containing the remaining seed region 9 as shown in FIG. 1e. The remaining seed region 9 had a length of 2 μm. The dimensions $y_s$, $z_s$ of the seed surface were 70 nm each, giving a seed surface area of $4.9 \times 10^3$ nm$^2$. The nanowire was then grown by MOCVD using the precursors trimethylindium and tertiarybutylarsenic at a molar flow ratio of 5.6/149.5 μMol/min=27 at a temperature of 520° C. This produced a nanowire of length 450 nm with transverse dimensions corresponding to those of seed surface 10.

While an illustrative example is given above, it will be appreciated that the basic fabrication steps described can be used to produce nanowires of other materials, shapes and sizes. Materials and processing techniques can be selected as appropriate for a given embodiment, and suitable choices will be readily apparent to those skilled in the art.

It will be seen that the above process allows local integration of semiconductor nanowires grown laterally on a substrate wafer. By restricting the dimensions of the seed surface in this lateral-tunnel arrangement such that growth proceeds from a single nucleation centre, crystal defects can be completely suppressed and defect-free nanowires achieved. High-quality nanowires are thus obtained via a convenient and inexpensive fabrication process which is compatible with CMOS processing techniques. The process is also highly flexible, permitting growth of nanowires with arbitrary shapes, dimensions and directions directly on the substrate. The shape and direction of tunnel 8 can be easily controlled when forming the template to provide nanowires with the required shapes and orientations. Since growth is confined to the tunnel, nanowire growth in a required direction is achievable irrespective of orientation of the semiconductor crystal structure to the nanowire axis. If required, the direction and cross-section of a nanowire can be varied along its length by appropriate shaping of the template in the above process. The above process therefore offers exceptional flexibility and ease of fabrication for superior-quality nanowires.

Figure 2:
FIG. 2 shows a linear array of nanowires during processing in accordance with the first fabrication process.

Of course, while the foregoing process description focuses solely on nanowire fabrication, other structures, whether other nanowires or other device components, can be formed at the same time. Particular process steps involved in nanowire formation, e.g. patterning, masking and etching steps etc., can thus be used simultaneously to create other structures on the substrate wafer 1. In a typical application, multiple nanowires can be fabricated simultaneously on wafer 1. By way of illustration, FIG. 2 is a high-resolution image of a linear array of nanowires produced by the above process. The image shows a stage of the fabrication process corresponding to FIG. 1g, prior to removal of the template and seed 9. In this particular example, the dimension marked x1 corresponds to the length of seed 9 and dimension x2 corresponds to the nanowire length. This illustrates the point that the critical feature of seed 9 is the area of the seed surface 10 exposed to the tunnel 8, and the length x1 of the seed is immaterial as far as nanowire growth is concerned. In practice, of course, multiple nanowires can be fabricated simultaneously with different shapes and directions at different locations on a substrate. Nanowires of different materials can be produced, if desired, by successive growth steps using different materials at different sites. Also, an individual nanowire can be formed as a hetero structure, having contiguous lengths of different semiconductor materials produced by successive growth steps within the same template.

While the above process begins with provision of a plain (unpatterned) XOI wafer, such a wafer can be provided pre-patterned with device features, including seed region(s) 5, in some embodiments. Moreover, fabrication can commence from substrates other than XOI wafers. By way of example, FIGS. 3a to 3d illustrate successive stages in a second nanowire fabrication process embodying the invention. The basic principles of this fabrication process are generally as described for the first embodiment above, and only the key differences will be described in the following.

Figure 3A:
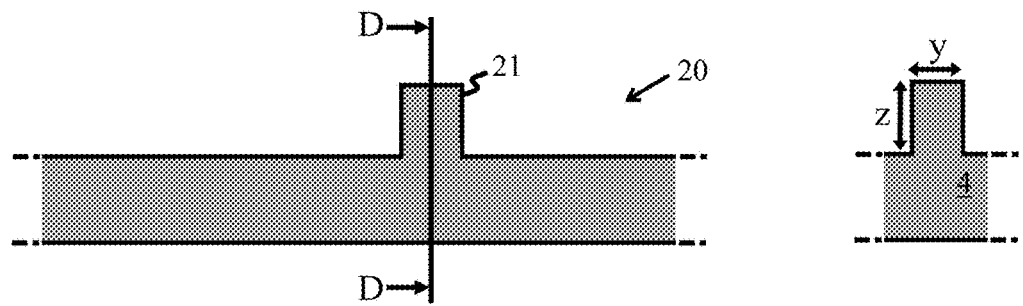
FIGS. 3a to 3e are schematic cross-sectional views illustrating successive stages in a second nanowire fabrication process embodying the invention. More specifically.

The second method begins with provision of a bulk semiconductor wafer 20, e.g. of silicon, which serves as a seed layer for the fabrication process. The surface of wafer 20 is first patterned to form a seed region 21 projecting from the surface of the wafer. In this simple example, the seed region 21 is generally rectangular in form as indicated in FIG. 3a. This seed region is of arbitrary length in the plane of the paper in the left-hand view in the figure. The right-hand view shows a schematic cross-section on D-D of the left-hand view. In this example, the transverse cross-section of seed region 21 has width y and thickness z which are greater than the corresponding dimensions of the nanowire to be formed.

Figure 3B:
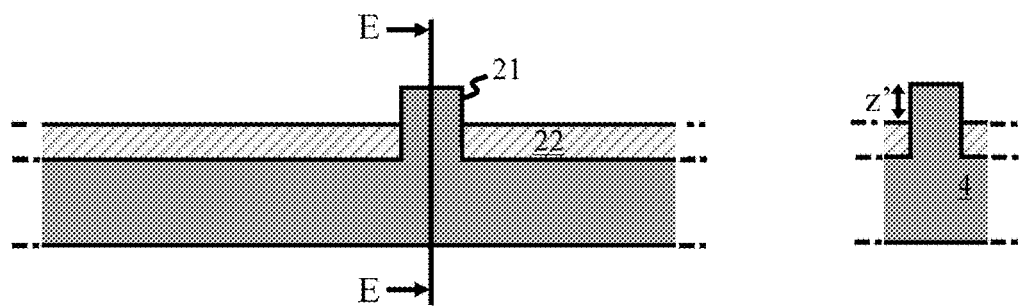

Next, an insulating layer 22, e.g. of silicon oxide, is formed on the surface of wafer 20 around seed region 21 such that the seed region projects through the layer 22. This is illustrated in FIG. 3b where the right-hand view again shows a schematic cross-section of the left-hand view, here on line E-E. The thickness z' of seed region 21 above layer 22 corresponds to the desired thickness of the nanowire to be formed in this example.

Figure 3C:
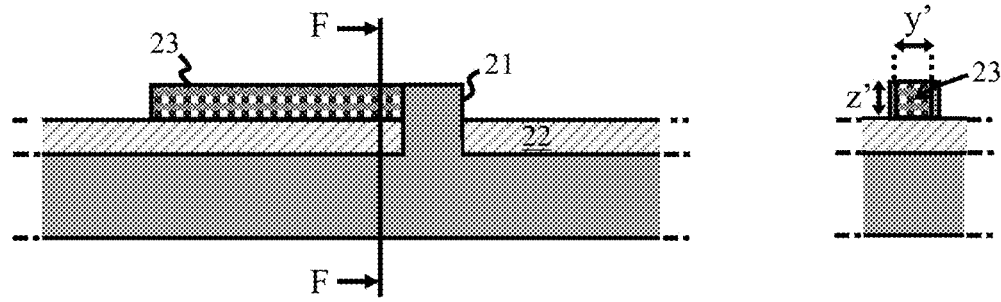

Referring to FIG. 3c, a sacrificial layer, e.g. of amorphous silicon, is then deposited over layer 22 and patterned to leave region 23 in the desired shape of the interior of the nanowire template. Region 23 thus defines the target shape of the nanowire. In this simple example, region 23 is shown as an elongate linear region of uniform rectangular cross-section having a width y', and a thickness z' corresponding to that of projecting seed region 22 here, as illustrated in the cross-section on F-F on the right-hand side of FIG. 3c.

Figure 3D:
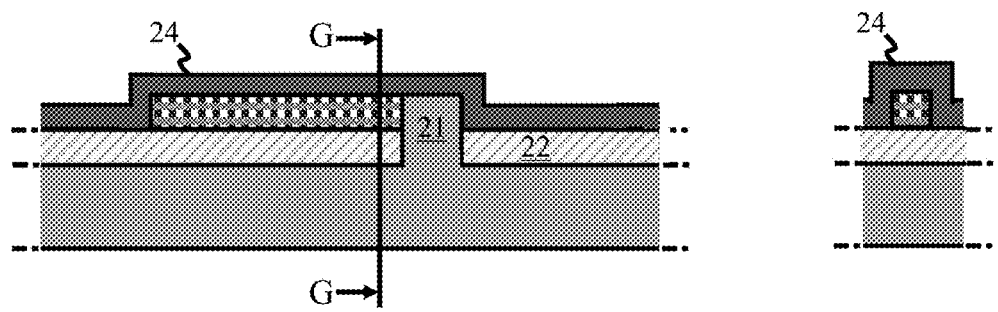

Next, a masking layer 24 is formed over, and in contact with, the region 23 and the surrounding insulating layer 22. The result of this step is illustrated in FIG. 3d, where the right-hand view shows a cross-section on G-G. The masking layer 24 thus covers the entire surface of the region 23. This masking layer 24 and the insulating layer 22 underlying region 23 will together form the nanowire template following subsequent processing steps. The material(s) of masking layer 24 and insulating layer 22 are thus selected to have a low sticking coefficient, and hence low nucleation probability, for the semiconductor material of the nanowire to achieve effective selective growth as discussed above.

Figure 3E:
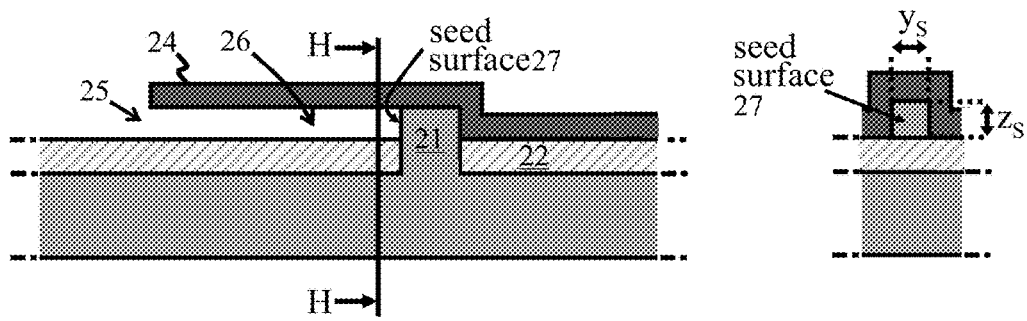

Referring to FIG. 3e, an opening 25 is defined in the masking layer 24 to expose the sacrificial region 23, and the sacrificial region 23 is removed selectively to the seed 21, e.g. by etching, via the opening 25 to form an elongate tunnel 26. The masking layer 24 and underlying insulating layer 22 thus together form the nanowire template. The seed region 21 occludes one end of the tunnel 26 providing the seed surface 27 exposed to the tunnel. This is illustrated in the right-hand view which shows a cross-section on H-H. As discussed above, the dimensions $y_s \times z_s$ of this seed surface are again such that the ensuing selective growth of the nanowire proceeds from a single nucleation point on the seed surface. In particular, after optional cleaning of the seed surface, the nanowire is selectively grown in the template from the seed surface, e.g. by MOCVD, as before. The masking layer and seed region can then be removed, if desired, to expose the resulting nanowire.

While particular examples have been described above, numerous other embodiments can be envisaged. Selective growth of the nanowire can be performed by methods other than metal-organic vapor phase deposition or migration enhanced epitaxy. For instance, hydride vapor phase epitaxy might be used in some methods. The seed surface in some embodiments can be provided by a surface region of an amorphous or polycrystalline semiconductor or a metal or metal-semiconductor alloy such as a metal silicide. If the seed has a well-defined crystalline orientation and if the crystal structure of the seed is a reasonable match to that of the growing crystal (for example Silicon and III-V compound semiconductors), the growing crystal can adapt this orientation. If the seed is amorphous or has an undefined crystal orientation, the growing crystal will be single crystalline but its crystal orientation will be random. The use of such seed materials is possible because the area of the seed surface is constrained as discussed above, whereby only a small region of the overall surface structure is exposed to the tunnel as the seed surface. In any case, as will be apparent to those skilled in the art, the seed should efficiently induce nucleation of the growing crystal which provides selectivity in the deposition process in relation to the template.

Figure 4:
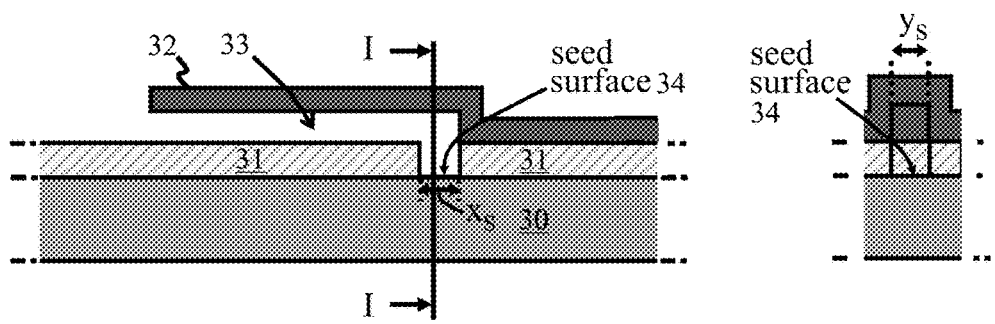
FIG. 4 illustrates structure of a nanowire template in another fabrication process embodying the invention.

In some embodiments, the seed surface can not extend across the transverse cross-section of the tunnel. The seed surface can, for example, be provided by a region of the upper surface of a seed layer of a substrate. A simple example of such an arrangement is shown in FIG. 4. This shows a substrate in the form of a semiconductor seed layer 30. A nanowire template is formed on the seed layer by an insulating layer 31, which overlies the substrate, and a masking layer 32 which is shaped to define the elongate, nanowire-shaped tunnel 33. The seed surface 34 here is provided by a region of seed layer 30 which is exposed to the tunnel 33 via a hole in insulating layer 31. The right-hand view here shows a cross-section on I-I. It can be seen that the seed surface 34 has a width $y_s$ and breadth $x_s$, where these dimensions are constrained as discussed above such that the nanowire can be selectively grown in the tunnel 33 from a single nucleation point on the seed surface. Suitable processing steps for forming the FIG. 4 structure will be readily apparent to those skilled in the art.

Figure 5A:
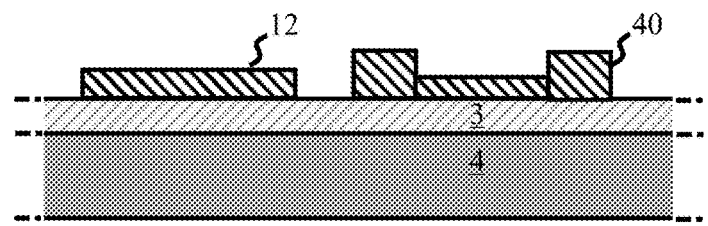
FIGS. 5a and 5b show examples of nanowires with varying cross-sections and branched structures produced by methods embodying the invention. More specifically.
Figure 5B:
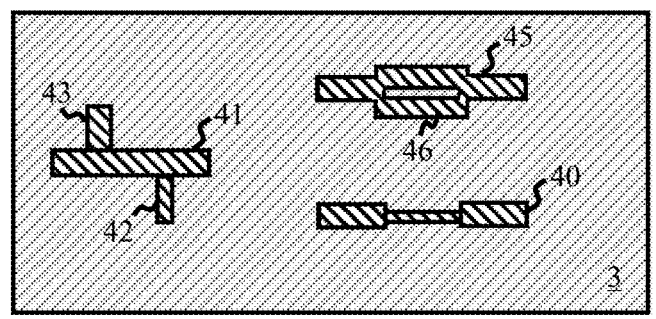

By appropriate shaping of the template in fabrication processes embodying the invention, nanowires can be formed with any desired shapes and cross-sectional dimensions, and the cross-section can be varied along the length of the nanowire if desired. FIG. 5a is a schematic side view illustrating an example of such a nanowire 40 formed next to the nanowire 12 of FIG. 1g. The nanowire 40 has sections of different transverse dimensions along its length. While a simple example is illustrated here, numerous other shape variations can of course be envisaged. Moreover, nanowires can be formed with curves, bends, junctions and branches by appropriate shaping of the template. In particular, the elongate tunnel in the nanowire template can have one or more branches extending therefrom. FIG. 5b is a schematic plan view showing particular examples of shape variations. In addition to nanowire 40 of FIG. 5a, a nanowire 41 is shown having two branches 42, 43 extending from the sides of the nanowire at offset positions along its length. Such branches might also form loops, rejoining the main nanowire body. An example of such a structure is illustrated by nanowire 45 which has bends along its length and a looped branch 46 which rejoins the nanowire body. Of course, many other possible variations of such structures can be envisaged.

Figure 6A:
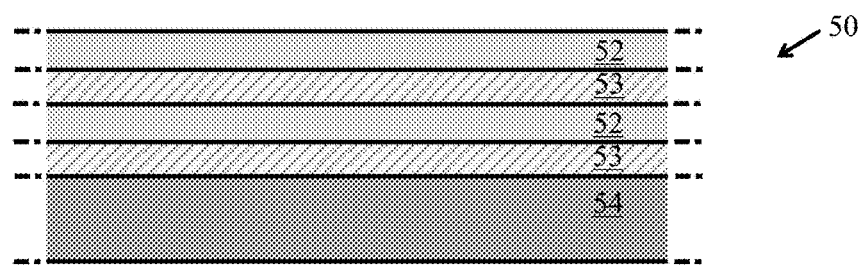
FIGS. 6a and 6b show stages in another fabrication process embodying the invention using vertically-stacked nanowire templates. More specifically.
Figure 6B:
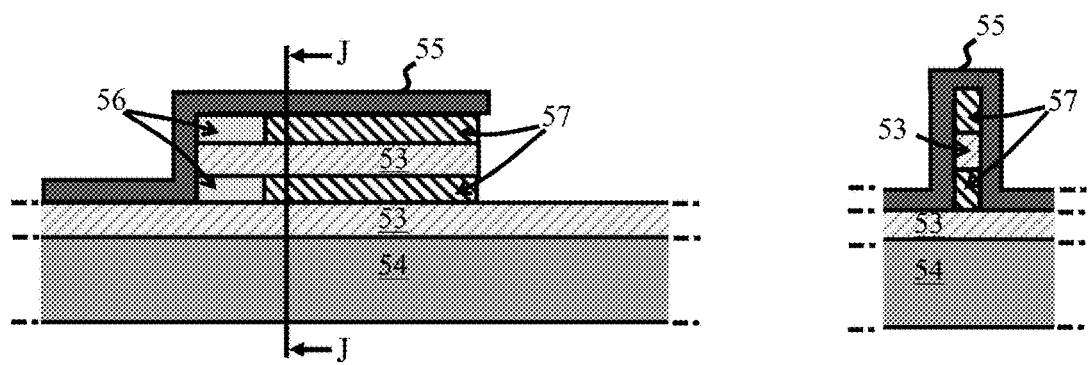

Fabrication can commence with other (plain or pre-patterned) substrate structures if desired. Some embodiments can use a substrate including a stack of layers which include a plurality of seed layers. These can then be processed in parallel to fabricate a plurality of vertically-offset nanowires using methods embodying the invention. By way of illustration, FIG. 6a shows one example of such an alternative substrate structure. The substrate 50 here is fabricated with two seed layers 52 alternating with insulating layers 53 in a vertical stack formed on handle wafer 54. The layer stack can be patterned generally as described above to form a vertical stack of nanowire seed regions, one from each seed layer 52, and thence two vertically-stacked nanowire templates in which two nanowires can be grown. FIG. 6b is a schematic cross-section, corresponding generally to FIG. 1f, illustrating an exemplary stacked structure. Two vertically-aligned nanowire templates are formed here by a masking layer 55 and the two insulating layers 53. The upper insulating layer 53 has been patterned during patterning of the seed regions and is contained within the masking layer as illustrated in the cross section on J-J shown on the right of the figure. After etching of the seed regions to leave seeds 56 in the vertically-stacked templates, lateral nanowires 57 can be grown simultaneously from the seed surfaces as before. While a simple example is illustrated here, this stacking concept can be extended to multiple seed layers and can be used to fabricate nanowires with various shapes and arrangements. Such parallel processing of vertically-stacked devices offers high device density on a chip without sacrificing device performance. Alternative embodiments of the invention can use substrates with a plurality of stacked seed layers for sequential processing of devices on separate layers. In this case, for instance, nanowire templates formed during device processing need not be vertically-aligned but can be vertically-stacked relative to the substrate and also laterally offset relative to one another. Such processing techniques open up the possibility for more complex three-dimensional chip designs.

One embodiment of an aspect of the present invention provides a method for fabricating a semiconductor nanowire on a substrate. The method includes: forming a nanowire template defining an elongate tunnel which extends, laterally over the substrate, between an opening in the template and a seed surface, the seed surface being exposed to the tunnel and of area up to about $2 \times 10^4$ nm$^2$; and via said opening, selectively growing the semiconductor nanowire in the template from the seed surface.

In methods embodying the invention, a template is first formed for the nanowire. This template thus defines an elongate tunnel, according to the elongate shape of the nanowire to be formed. This tunnel extends laterally over the substrate (where the term "laterally" is used in this context, as is customary, to indicate orientation generally parallel to the plane of the substrate, as opposed to generally vertically, or outwardly, from the substrate surface). The tunnel extends between an opening in the template at one end of the tunnel and a seed surface, which is exposed to the tunnel, at the other end. This seed surface has an area of up to about $2 \times 10^4$ nm$^2$, whereby the seed surface area is broadly similar to the cross-sectional area of a nanowire. By restricting the dimensions of the seed surface in this lateral-tunnel arrangement, defects can be greatly inhibited and very high quality nanowires can be grown laterally in the template by selective epitaxial growth from the seed surface. This allows local integration of high-quality nanowires on substrates via a convenient, inexpensive fabrication process which is compatible with conventional CMOS (Complementary Metal Oxide Semiconductor) processing techniques. Moreover, since the shape of the laterally-arranged tunnel can be easily controlled when forming the template, nanowires can be readily produced with arbitrary and/or varying cross-sections and directions, offering ease and flexibility of device fabrication. Embodiments of the invention can thus offer significant advantages over the prior nanowire fabrication techniques discussed above. Catalytic metal particles, for instance, often lead in prior techniques to metal contamination, and geometrical control over the position, direction, and structure is often undefined. In addition, the vertical orientation of the nanowires in prior techniques can lead to particularly complicated device processing. In contrast, well-established device processes can be used with the lateral nanowire arrangement provided by embodiments of the invention.

As indicated above, the seed surface according to embodiments of the invention has an area of up to about $2 \times 10^4$ nm$^2$ (say within 10%, i.e. up to $2.2 \times 10^4$ nm$^2$). The seed surface area is preferably no greater than about $10^4$ nm$^2$ (say within 10%), and is most preferably no greater than $10^4$ nm$^2$. In particularly preferred embodiments, the area of the seed surface is such that growth of the nanowire proceeds from a single nucleation point on the seed surface. When growth in the tunnel starts with only one nucleation point, crystal defects such as anti-phase boundary defects and threading dislocation defects can be completely suppressed, whereby defect-free nanowires can be fabricated with this elegantly simple technique while maintaining control over the shape of the structure, and without the use of catalytic metal particles. This is a significant advantage over prior confined ELO techniques where nucleation can occur at multiple sites along the elongate seed stripes and defects created upon coalescence of these nuclei can always be present.

As with the cross-sectional area of a typical nanowire, the seed surface preferably has a width of up to about 100 nm and a breadth, perpendicular to said width, of up to about 100 nm. In preferred arrangements the seed surface extends across the transverse tunnel cross-section and thus occludes one end of the tunnel. The seed surface area is then dependent on the tunnel dimensions. In particular, the seed surface can be substantially perpendicular to the longitudinal axis of the tunnel, whereby the dimensions of the seed surface correspond to those of the transverse cross-section of the nanowire to be formed.

In general, the substrate can include one or more layers. In some embodiments, the template can be formed in part by the substrate. For example, an upper layer of the substrate can provide a lower part of the template. The seed surface can conveniently be provided by a layer of the substrate. In a particularly simple fabrication process, the substrate includes a seed region, in the shape of the interior of said template, overlying and in contact with an insulating layer such that the insulating layer is exposed around the seed region. The method according to this embodiment includes: forming a masking layer in contact with the seed region and the insulating layer whereby the masking layer and insulating layer provide the nanowire template; defining an opening in the masking layer to provide said opening in the template; and via said opening, removing part of the seed region to form said tunnel whereby a remaining part of the seed region provides said seed surface.

Such embodied methods are readily applicable to semiconductor-on-insulator (XOI) wafers. These substrates have a thin semiconductor device layer on an insulating oxide layer which overlies a thick semiconductor handle wafer. The device layer can be pre-patterned to define the seed region for template formation here, or the method can include a patterning step to form the seed region. In particular, such methods can include the step of patterning a seed layer (e.g. the device layer of an XOI wafer) overlying the insulating layer of the substrate to form said seed region and expose the insulating layer around the seed region.

In other methods embodying the invention, the nanowire template can be formed by any convenient processing techniques on a substrate which does not have an existing insulating layer. For example, in some embodiments the substrate can simply include a semiconductor layer serving as a seed layer which is then patterned to form a seed region projecting from the surface of the seed layer. The nanowire template can then be formed on the seed layer such that the seed region occludes one end of the tunnel and provides the seed surface in the tunnel. Such a method can conveniently be applied, for example, where the substrate includes a bulk semiconductor wafer.

By appropriate shaping of the nanowire template, nanowires embodying the invention can be readily produced with varying cross-sectional shapes, as well as with bends, junctions and branches. The elongate tunnel defined by the template can therefore have one or more branches, also defined by the template, extending therefrom.

While the seed surface can be a monocrystalline semiconductor surface, this is not essential. In particular, because the area of the seed surface is constrained as discussed above, the seed surface can be provided by a surface of an amorphous or polycrystalline semiconductor or a metal or a metal-semiconductor alloy such as a metal silicide. This will be discussed in more detail below.

In particularly preferred embodiments, the nanowire includes a compound semiconductor material and the aforementioned seed region conveniently includes a material selected from silicon, germanium and their alloys. Such methods offer direct integration of compound semiconductor nanowires on semiconductor substrates.

An embodiment of a second aspect of the invention provides a method for fabricating a plurality of semiconductor nanowires on a substrate. The method includes fabricating each nanowire by a method according to embodiments of the first aspect of the invention, wherein the nanowire templates are vertically-stacked on the substrate. Methods embodying this aspect of the invention can exploit substrates including a plurality of vertically-stacked seed layers which can be processed in parallel or sequentially to form vertically-stacked nanowires.

According to an embodiment of a third aspect of the invention there is provided a structure including a semiconductor nanowire and a substrate, wherein the structure is obtainable by a method according to any one of the embodied methods of the first and the second aspect of the invention. According to embodiments of this aspect of the invention structures, in particular semiconductor devices, are provided that include one or more nanowires on a substrate, wherein the structure has been obtained/manufactured/fabricated by the embodied methods of the first and/or the second aspect of the invention.

It will be appreciated that many other changes and modifications can be made to the exemplary embodiments described without departing from the scope of the invention.

What is claimed is:

1. A method for fabricating a semiconductor nanowire on a substrate, the method comprising:
   forming a semiconductor layer on a surface of an insulating layer over a substrate;
   patterning the semiconductor layer to form a seed region in the shape of an interior of a nanowire template defining an elongated tunnel which extends laterally over the substrate;
   forming a masking layer in contact with the seed region and the insulating layer, the masking layer covering a top surface and opposite sidewalls of the seed region;
   opening the masking layer to expose a sidewall of the seed region;
   recessing the seed region from the exposed sidewall to form a tunnel, the seed region recessed such that a remaining portion of the seed region provides a seed surface comprising a semiconductor material; and
   selectively growing the semiconductor nanowire in the tunnel from the seed surface using metal-organic vapor phase deposition (MOCVD) or migration enhanced epitaxy (MEE);
   wherein the seed surface comprises a length and a width that are less than an average diffusion length of the semiconductor nanowire at an operating temperature of the selective growth.

2. The method according to claim 1, wherein an area of the seed surface is no greater than about $10^4$ nm$^2$.

3. The method according to claim 2, wherein the area of the seed surface is such that growth of the nanowire proceeds from a single nucleation point on the seed surface.

4. The method according to claim 1, wherein the seed surface has a width of up to about 100 nm and a breadth, perpendicular to said width, of up to about 100 nm.

5. The method according to claim 1, wherein the seed surface occludes one end of the tunnel.

6. The method according to claim 5, wherein the seed surface is perpendicular to the longitudinal axis of the tunnel.

7. The method according to claim 1, wherein the seed surface is a monocrystalline semiconductor surface.

8. The method according to claim 1, wherein the seed surface is a surface of consisting of at least one of: an amorphous semiconductor, a polycrystalline semiconductor, a metal, and a metal-semiconductor alloy.

9. The method according to claim 1, wherein said elongate tunnel has one or more branches, defined by the template, extending therefrom.

10. The method according to claim 9, wherein the substrate comprises a semiconductor-on-insulator wafer having a semiconductor layer providing said seed layer.

11. The method according to claim 10, wherein the seed region comprises at least one of: silicon, germanium and alloys thereof.

12. The method according to claim 1, wherein the nanowire comprises a compound semiconductor material.

13. A method for fabricating a plurality of semiconductor nanowires on a substrate, the method comprising:
   forming a stack comprising two or more semiconductor layers alternating with two or more insulating layers on a surface of a substrate;
   patterning the two or more semiconductor layers to form seed regions, each seed region in the shape of an interior of a plurality of nanowire templates defining an elongated tunnel which extends laterally over the substrate;
   forming a masking layer on a top surface and opposite sidewalls of a topmost seed region of the stack;
   opening the masking layer to expose a sidewall of each of the seed regions;
   recessing the seed regions from the exposed sidewalls to form a plurality of tunnels, the seed regions recessed such that remaining portions of the seed regions provide a seed surface comprising a semiconductor material; and
   selectively growing the plurality of semiconductor nanowires in the tunnels from the seed surface using metal-organic vapor phase deposition (MOCVD) or migration enhanced epitaxy (MEE);
   wherein the nanowire templates are vertically-stacked on the substrate; and
   wherein each seed surface comprises a length and a width that are less than an average diffusion length of the semiconductor nanowires at an operating temperature of the selective growth.

14. A structure comprising a semiconductor nanowire and a substrate, the structure comprising:
   a nanowire template defining a plurality of vertically stacked, elongated tunnels which extend laterally over the substrate;
   a seed region within each of the elongated tunnels, each seed region comprising a seed surface having an area of less than about $2 \times 10^4$ nm$^2$; and
   a semiconductor nanowire selectively grown in each of the tunnels from the seed surfaces;
   wherein each seed surface comprises a length and a width that are less than an average diffusion length of the semiconductor nanowire at an operating temperature of the selective growth.

* * * * *